United States Patent [19]
Nair et al.

[11] Patent Number: 5,942,952
[45] Date of Patent: Aug. 24, 1999

[54] VCO WITH MULTIPLE NEGATIVE DIFFERENTIAL RESISTANCE DEVICES

[75] Inventors: Vijay K. Nair, Mesa; Nada El-Zein, Phoenix; Kumar Shiralagi, Chandler; George N. Maracas, Phoenix; Herbert Goronkin, Tempe, all of Ariz.

[73] Assignee: Motorola, Inc., Schaumburg, Ill.

[21] Appl. No.: 08/903,081

[22] Filed: Jul. 30, 1997

[51] Int. Cl.$^6$ ..................................................... H03B 7/14

[52] U.S. Cl. ............... 331/115; 331/108 C; 331/117 FE; 331/117 D; 331/177 R

[58] Field of Search .............................. 331/115, 117 FE, 331/117 D, 177 R, 107 G, 107 T, 108 C, 108 D, 117 R

[56] References Cited

U.S. PATENT DOCUMENTS

| | | | |
|---|---|---|---|
| 3,246,456 | 4/1966 | Sommers, Jr. ....................... | 331/107 T |
| 3,312,911 | 4/1967 | De Boer .............................. | 331/107 T |
| 3,701,051 | 10/1972 | Simms ................................. | 331/107 T |

OTHER PUBLICATIONS

Olga Boric–Lubecke et al., "DC Instability of th Series Connection of Tunneling Diodes", IEEE Transactions on Microwave Theory and Techinques, vol. 44, No. 6, Jun. 1996, pp. 936–943.

Olga Boric–Lubecke et al., "Fundamental and Subharmonic Excitation for an Oscillator with Several Tunneling Diodes in Series", IEEE Transactions on Microwave Theory and Techniques, vol. 43, No. 4 Apr. 1995, pp. 969–976.

Primary Examiner—Siegfried H. Grimm
Attorney, Agent, or Firm—Eugene A. Parsons

[57] ABSTRACT

A VCO includes a transistor having a plurality of negative differential resistance devices coupled in series to the source terminal of the transistor, with each of the devices having a negative differential resistance operating region. Biasing circuits are coupled to the drain and gate terminals along with operating voltages which set the oscillator to operating in a negative differential resistance region of at least one of the negative differential resistance devices so that oscillations of a selected frequency are produced at an output terminal. The transistor, the plurality of N devices, the DC biasing circuits, and the operating voltages are connected so that the oscillator negative differential resistance operating region is greater than N times as wide as each of the device negative differential operating regions individually.

14 Claims, 3 Drawing Sheets

5,942,952

VCO WITH MULTIPLE NEGATIVE DIFFERENTIAL RESISTANCE DEVICES

FIELD OF THE INVENTION

The present invention pertains to voltage controlled oscillators and more specifically to oscillators constructed to be controlled over a wider tuning range.

BACKGROUND OF THE INVENTION

In the prior art, voltage controlled oscillators (VCOs) generally require a large number of components to form the various parts required for oscillation and control. For example, generally inductors and capacitors are required to form a tank, or resonant, circuit and additional components are required to change the resonant frequency. At least one of these components must change with the application of a voltage so that the resonant frequency can be varied. Specifically, in a varactor oscillator, the varactor operates like a capacitor (provides capacitance) which varies in accordance with the voltage applied across the varactor. In other oscillators resonance is provided by tuned magnetic circuits but many components are still required to provide the voltage control.

In a copending United States Patent Application entitled "Dual Voltage Controlled Oscillator and Method of Operation", filed Jul. 1, 1996, with Ser. No. 08/673,879, now U.S. Pat. No. 5,708,398, and assigned to the same assignee, a VCO is disclosed which uses a single negative differential resistance (NDR) device in series with a transistor to produce a novel VCO. It is, however, desirable to produce an improved VCO with a wider tuning range which can be used, for example, in communication equipment such as transmit/receive modules.

Accordingly, it is a purpose of the present invention to provide a new and improved oscillator with wider tuning range.

It is another purpose of the present invention to provide a new and improved oscillator with wider tuning range which is simple to fabricate and which includes a minimum of components.

It is still another purpose of the present invention to provide a new and improved oscillator with wider tuning range which can be fabricated on a single substrate.

It is a further purpose of the present invention to provide a new and improved voltage controlled oscillator with wider tuning range which is integrated into a single device.

SUMMARY OF THE INVENTION

The above problems and others are at least partially solved and the above purposes are realized in a VCO with multiple negative resistance devices including a transistor having a plurality of negative differential resistance devices coupled in series to a first terminal with each of the devices having a negative differential resistance operating region. Biasing circuits are coupled to second and third terminals of the transistor along with operating voltages which set the VCO to operate in a negative differential resistance region of at least one of the negative differential resistance devices so that oscillations of a selected frequency are produced at an output terminal. The transistor, the plurality of N devices, the DC biasing circuits, and the operating voltages are connected so that the VCO negative differential resistance operating region is greater than N times as wide as each of the device negative differential operating regions individually.

BRIEF DESCRIPTION OF THE DRAWINGS

Referring to the drawings.

DESCRIPTION OF THE PREFERRED EMBODIMENTS

Figure 1:
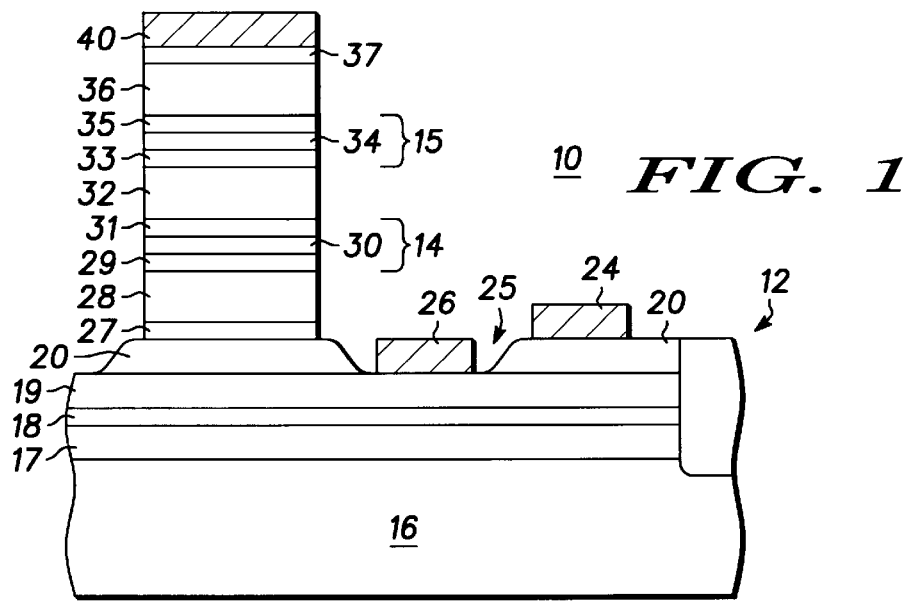
FIG. 1 is a simplified sectional view of a resonant tunneling device including a plurality of integrated negative differential resistance diodes and a transistor in accordance with the present invention.

Turning now to the drawings in which like reference characters indicate corresponding elements throughout the several views, attention is first directed to FIG. 1 which illustrates a resonant tunneling field-effect device generally designated by the reference character 10. Resonant tunneling field-effect device 10 includes a heterojunction field-effect transistor 12 formed of a gallium arsenide based material system and two resonant tunneling diodes 14 and 15.

One method of fabricating device 10 (HFET 12 and RTDs 14 and 15) of FIG. 1 is to provide a substrate 16 having a heterostructure of layers of material grown on a planar surface thereof. While specific materials in a specific material system and specific layer thicknesses are utilized herein for example, it will be understood that some changes may be made without effecting the purpose herein described. Substrate 16 is formed of semi-insulating gallium arsenide (GaAs). A buffer layer 17 of gallium arsenide (GaAs) is epitaxially grown on the planar surface thereof to reduce crystal stress in subsequent layers. A channel layer 18 of indium gallium arsenide (InGaAs) is epitaxially grown on the surface of buffer layer 17. A supply layer 19 of aluminum gallium arsenide (AlGaAs) is grown on the surface of channel layer 18. A relatively heavily doped contact layer 20 of GaAs is grown on the surface of supply layer 19. Layer 20 is doped, for example, with silicon ions or the like to a density of approximately $2 \times 10^{18}$ cm$^{-3}$ to provide relatively good conductivity, for reasons that will become apparent presently.

At this point several different methods of fabrication may be utilized, depending primarily on the sequence of the following steps. Thus, a first method of fabrication will be described with some possible variations in the sequence of steps explained later.

An etch stop layer 27 of aluminum arsenide (AlAs) is grown on the surface of contact layer 20. A first resonant tunneling, or transition, layer 28 of indium aluminum arsenide (InAlAs) is grown on the surface of etch stop layer 27. A first relatively thin (approximately 25 Å–50 Å) barrier layer 29 of indium gallium arsenide (InGaAs) is epitaxially grown on the surface of InAlAs resonant tunneling layer 28, followed by a quantum well layer 30 of InAlAs (preferably 15 Å–25 Å thick), and, in turn, followed by a second relatively thin barrier layer 31 of InGaAs to complete diode 14. A resonant tunneling, or transition, layer 32 of indium aluminum arsenide (InAlAs) is grown on the surface of barrier layer 31 as an intermediate layer between diodes 14 and 15. A first relatively thin (approximately 25 Å–50 Å) barrier layer 33 of InGaAs is epitaxially grown on the surface of InAlAs resonant tunneling layer 32, followed by a quantum well layer 34 of GaSb (preferably 15 Å–25 Å thick),.and, in turn, followed by a second relatively thin barrier layer 35 of InGaAs. A second relatively heavily doped layer 36 of InAlAs is epitaxially grown on barrier layer 35 followed by a final contact layer 37 of heavily doped InGaAs.

The epitaxial structure is formed into HFET 12 and RTDs 14 and 15 in one fabrication method by etching and properly applying external contacts as follows. A first ohmic contact 40 is formed with final InGaAs layer 37, which contact serves as one terminal for device 10. Using contact 40 as a mask, the upper layers, i.e. layers 28–36 are etched down to etch stop layer 27. The etched mesa formed by ohmic contact 40 and layers 28–36, illustrated in FIG. 1, form RTDs 14 and 15.

As is also illustrated in FIG. 1, a second ohmic contact 24 is formed with heavily doped GaAs contact layer 20, in spaced relationship to RTDs 14 and 15, by some convenient method. Both of the contacts 40 and 24 are formed of some convenient metal system, such as nickel-gold-germanium (NiAuGe) which is applied by any convenient method, such as evaporation and lift-off. A gate contact area 25 is defined between contact 24 and the mesa, using some convenient method such as mask and photoresist. Heavily doped GaAs contact layer 20 is removed by etching or the like in gate contact area 25 and a Schottky metal contact 26 is formed on the exposed upper surface of supply layer 19 in gate contact area 25. While this specific embodiment illustrates device 10 as including a heterojunction field effect transistor, it will be understood by those skilled in the art that many other types of transistors can be utilized and that the heterojunction field effect transistor is only being used for purposes of this description. Additional information on GaAs based FETs can be found in U.S. Pat. No. 5,477,169, entitled "Logic Circuit With Negative Differential Resistance" and issued Dec. 19, 1995. Additional information on Si based FETs can be found in a copending patent application entitled "Resonant Tunneling Field Effect Transistor" bearing Ser. number 08/625,667 and filed on Mar. 29, 1996.

In place of an electrode, which would provide an external contact to the source of HFET 12, resonant tunneling diode 14 and resonant tunneling diode 15 are formed on the source of HFET 12 so as to be connected in series. Therefore, in this specific example, drain 24, source 40 and gate 26 are current carrying contacts and a control contact respectively, operating as a conventional HFET. However, it should be understood that resonant tunneling field-effect device 10 is not limited to a specific type of field-effect transistor and any field-effect transistor may be employed, for example an InP FET, an MOS field-effect transistors, etc., which will become readily apparent with the subsequent embodiments. It will of course be understood that, while only two negative differential resistance devices are illustrated herein for example, virtually any convenient number may be used in specific applications.

Figure 2:
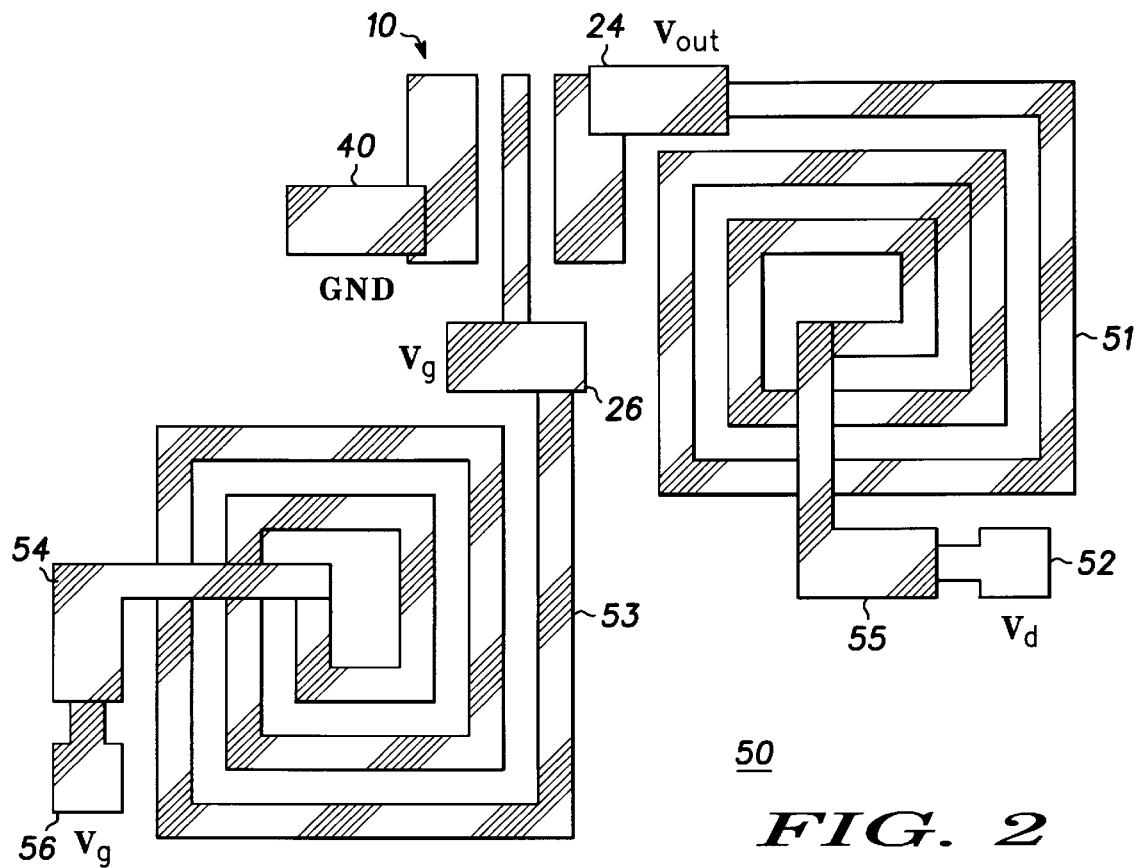
FIG. 2 is a simplified view in top plan of a voltage controlled oscillator utilizing the integrated device of FIG. 1, in accordance with the present invention.
Figure 3:
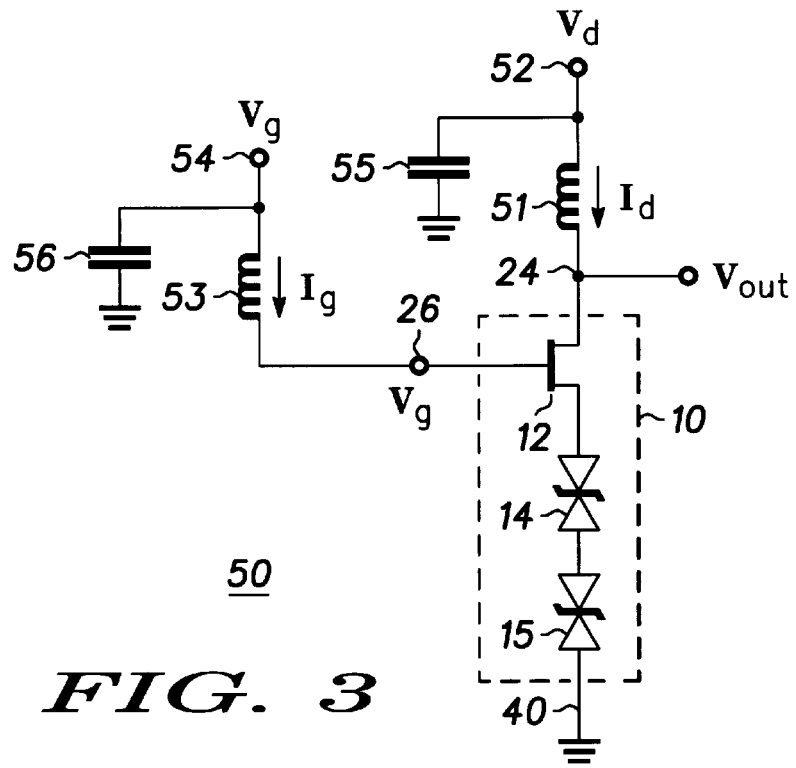
FIG. 3 is a schematic diagram of the voltage controlled oscillator of FIG. 2.

Turning now to FIGS. 2 and 3, a top plan view and schematic view are illustrated, respectively, of a voltage controlled oscillator 50 utilizing resonant tunneling field-effect device 10 of FIG. 1, in accordance with the present invention. It will of course be understood that device 10 of FIG. 1 is being utilized for example only and many other devices including a different field effect transistor with several negative differential resistance diodes could be utilized. Voltage controlled oscillator 50 includes resonant tunneling field-effect device 10, an inductance 51 and capacitance 55, and an inductance 53 and capacitance 56.

As can be seen most clearly in the schematic diagram of FIG. 3, one terminal of resonant tunneling diode 14 is connected to the source of field-effect transistor 12 and the other terminal of resonant tunneling diodes 15 (contact 40) is grounded or otherwise connected to a common potential. Gate contact 26 of field-effect transistor 12 is connected to inductance 53, which is formed on the substrate of field-effect transistor 12, and drain contact 24 of field-effect transistor 12 is connected to inductance 51, which is formed on the substrate of field-effect transistor 12 to completely integrate the circuit. Terminals 52 and 54 of inductances 51 and 53, respectively, are externally available for the application of suitable control voltages, as will be explained presently. Also, capacitances 55 and 56, which may be formed as a part of the integrated circuit (as shown) or provided externally, are connected to terminals 52 and 54 to complete biasing circuits, in conjunction with inductances 51 and 53, respectively.

Figure 4:
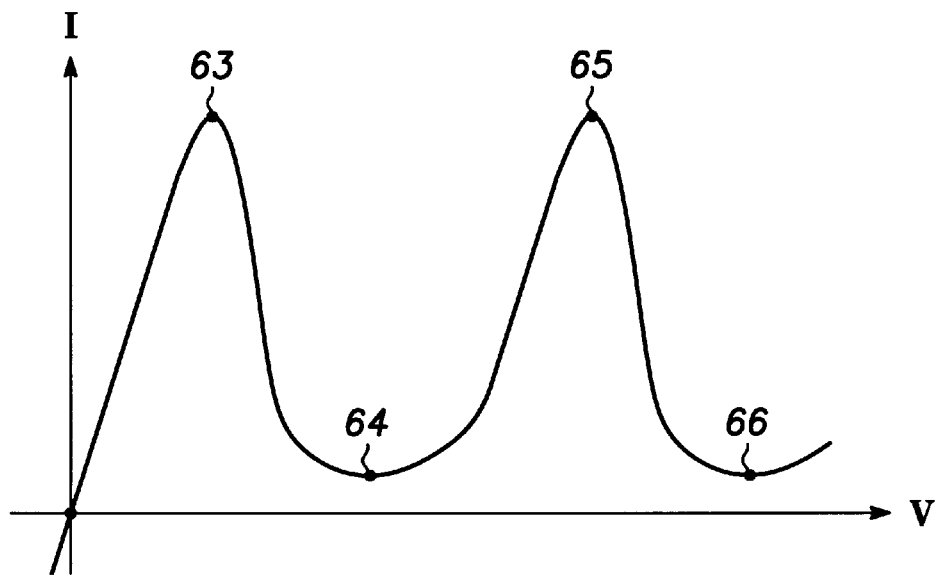
FIG. 4 is a graphical representation of a current-voltage curve of the resonant tunneling diode of FIG. 1.

Referring specifically to FIG. 4, a graphical representation of a DC current-voltage curve of resonant tunneling field-effect diodes of FIG. 1 is illustrated. It should be understood that the DC curve of FIG. 4 shows only the resistive current while in the RF regime both the resistive and capacitive currents are present. As can be seen, resonant tunneling device 14, provides transistor 10 with a negative differential resistance operating region between a peak 63 and a valley 64. Further, resonant tunneling device 15, provides transistor 10 with a second negative differential resistance operating region between a peak 65 and a valley 66. The two negative differential resistance operating regions are separated by the positive differential resistance operating region between valley 64 and peak 65 so that it would appear that continuous operation will not occur. However, it has been found that in the RF regime (as opposed to the above described DC regime) the current voltage curve (not shown) includes a continuous negative differential resistance operating region for the oscillator which is much broader (more than twice) than either of the individual DC negative differential resistance operating regions. In fact, the oscillator negative differential resistance operating region is produced by the cooperation of each of resonant tunneling devices 14 and 15 and the individual negative differential resistance operating regions.

In the operation, when the DC bias is increased, both resonant tunneling devices 14 and 15 are initially biased in the positive differential regions of the I-V curve of FIG. 4 and the voltage is divided equally between the devices. As the DC bias is further increased, resonant tunneling devices 14 and 15 are biased into the negative differential regions. As soon as resonant tunneling devices 14 and 15 start to operate simultaneously in the negative resistance region, any difference in bias voltage, ($\Delta V$), between resonant tunneling devices 14 and 15 generated due to the noise or device structure variations, will grow proportional to the RC time constant associated with the negative differential resistance region. The device bias points will eventually move to the positive differential resistance region when the difference in voltage ($\Delta V$) between the resonant tunneling devices 14 and 15 is equal to the extent of the negative differential resistance region. Because of this behavior, the DC curve (FIG. 4) of the series connected resonant tunneling devices 14 and 15 shows multiple peaks.

Even though there are multiple negative differential resistance regions in the DC curve, there is a minimum oscillation frequency for the oscillator with series connected resonant tunneling devices 14 and 15. This is because the negative differential resistance region that effectively exists during oscillation is not what is seen in the DC curve. When N series connected resonant tunneling devices (e.g. 14 and 15) are oscillating simultaneously, the I-V curve of a single device is effectively stretched N times, or more, along the voltage axis and there is only one negative differential resistance operating region, at least N times wider than each negative differential resistance operating region of resonant tunneling devices 14 and 15 individually. Such stretched I-V curve can be observed only if the voltage of a curve tracer is swept at a frequency greater than the minimum oscillating frequency. This wider voltage range for the oscillator negative differential resistance region results in a wider tuning range for the voltage controlled oscillator with multiple negative resistance devices.

Figure 5:
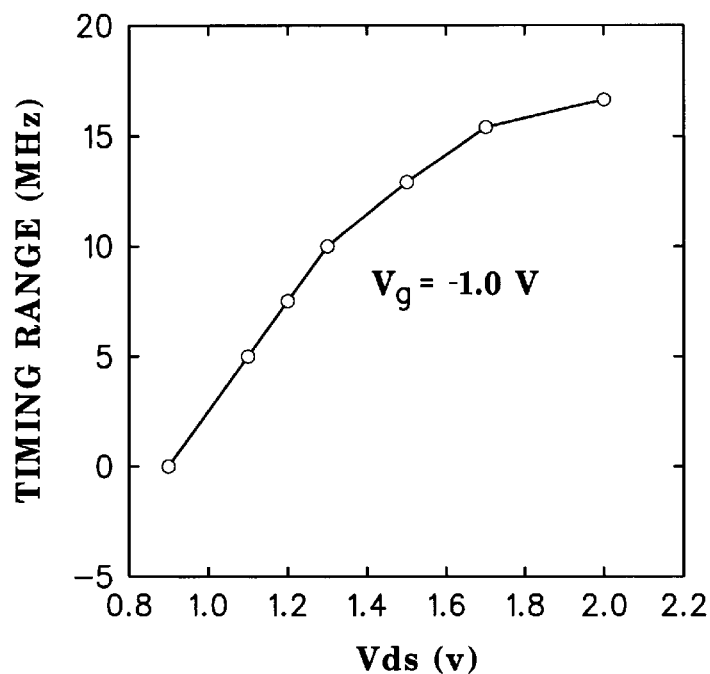
FIG. 5 is a graphical representation of the frequency dependence of the prior device on the applied operating voltages.
Figure 6:
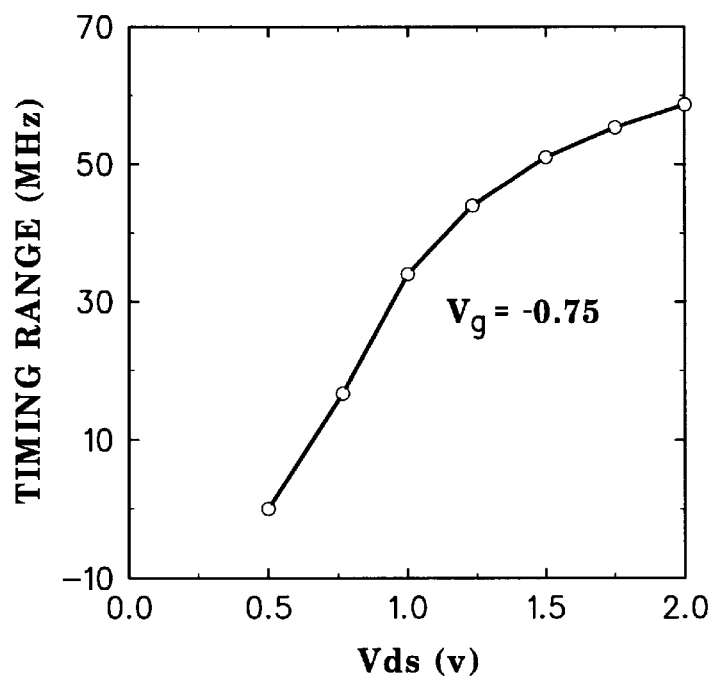
FIG. 6 is a graphical representation of the frequency dependence of the device of FIG. 2 on the applied operating voltages.

To illustrate the wider tuning range achievable with the present invention, FIG. 5 illustrates the complete range for a voltage controlled oscillator with a single negative resistance device. Referring specifically to FIG. 6, the wider range for a voltage controlled oscillator with a plurality of negative resistance device connected in series therewith, in accordance with the present invention, is illustrated. As understood by those skilled in the art, the tuning range actually used is generally selected to be a linear portion of the curve (e.g. from 0.5 Volt to 1.0 Volt in FIG. 6) so that the actual tuning range is somewhat narrower than the complete range illustrated. As can be seen from a comparison of FIGS. 5 and 6, the complete and/or the tuning range of the device illustrated and described herein is greater than twice as wide as the complete or the tuning range of a voltage controlled oscillator with a single negative resistance device.

The graph of FIG. 6 generally illustrates the frequencies of oscillation over which voltage controlled oscillator 50 can be adjusted. It will of course be understood that changes of materials and sizes can affect the operating frequencies, so that the graph of FIG. 6 is only intended to be a guide to possible frequencies which can be achieved. Also, it should be understood that the center frequency of this embodiment can be designed by selecting proper values of inductances 51 and 53, FET 12 and diodes 14 and 15 and, with a properly centered operating frequency, the oscillation frequency can be tuned by either of the two voltages ($V_d$ and $V_g$) applied thereto.

Thus, a novel voltage controlled oscillator is disclosed which utilizes a semiconductor device with a wider negative differential resistance region of operation than prior art devices. The semiconductor device includes a transistor and multiple series connected diodes, such as resonant tunneling diodes, or the like, generally integrated into a single component. The oscillator further includes bias circuits integrated onto the same substrate as the single integrated component so that the entire oscillator is very small and compact. Further, the novel voltage controlled oscillator has very few components (generally 5 to 7) so that it is very inexpensive to manufacture. Also, because the oscillation frequency can be tuned by either or both of two voltages, extra design flexibility is obtained.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A voltage controlled oscillator with multiple negative resistance devices comprising a transistor having a plurality of N negative differential resistance devices coupled in series to a first terminal thereof with each of the negative differential resistance devices having a negative differential resistance operating region, a first biasing circuit coupled to a second terminal of the transistor, and a second biasing circuit coupled to a third terminal of the transistor, the second and third terminals of the transistor having applied thereto operating voltages which set the oscillator to operating in a negative differential resistance region of at least one of the negative differential resistance devices so that oscillations of a selected frequency are produced at an output terminal, and the transistor, the plurality of N negative differential resistance devices, the first and second dc biasing circuits and the operating voltages being connected so that the oscillator has a negative differential resistance operating region which is at least equal to N times as wide as each of the device negative differential operating regions individually.

2. A voltage controlled oscillator with multiple negative resistance devices as claimed in claim 1 wherein the transistor is a heterojunction field effect transistor.

3. A voltage controlled oscillator with multiple negative resistance devices as claimed in claim 2 wherein the plurality of negative differential resistance devices each includes a resonance tunneling diode.

4. A voltage controlled oscillator with multiple negative resistance devices as claimed in claim 3 wherein the transistor and the plurality of negative differential resistance devices are integrated into a single heterojunction interband tunneling transistor circuit.

5. A voltage controlled oscillator with multiple negative resistance devices as claimed in claim 1 wherein the first, second and third terminals of the transistor are source, drain and gate terminals, and the plurality of negative differential resistance diodes are connected in series to the source terminal of the transistor and the operating voltages are connected to the drain and gate terminals.

6. A voltage controlled oscillator with multiple negative resistance devices comprising a heterostructure field effect transistor having gate, drain and source terminals, a plurality of negative differential resistance diodes coupled in series to the source terminal of the transistor, each of the negative differential resistance diodes having a negative differential resistance operating region, a first dc biasing circuit coupled to the drain terminal of the transistor and a second dc biasing circuit coupled to the gate terminal of the transistor, and operating voltages which set the oscillator to operating in a negative differential resistance region of at least one of the diodes connected through the first and second dc biasing circuits to the drain terminal and the gate terminal, respectively, so that oscillations of a selected frequency are produced at an output terminal, and varying at least one of the first and second operating voltages varies the frequency of the oscillations at the output through an oscillator negative differential resistance operating region broader than the negative differential resistance operating regions of each of the plurality of diodes individually.

7. A voltage controlled oscillator with multiple negative resistance devices as claimed in claim 6 wherein the transistor and the plurality of negative differential resistance diodes are integrated into a single heterojunction interband tunneling transistor circuit.

8. A voltage controlled oscillator with multiple negative resistance devices comprising a heterostructure field effect transistor having gate, drain and source terminals, a plurality of negative differential resistance diodes coupled in series to the source terminal of the transistor, each of the negative differential resistance diodes having a negative differential resistance operating region, a first inductance coupled to the gate terminal of the transistor, a second inductance coupled to the drain terminal of the transistor, and operating voltages which set the oscillator to operating in a negative differential resistance operating region of at least one of the diodes connected through the first and second inductances to the gate and drain terminals respectively so that oscillations of a selected frequency are produced at an output terminal, and varying at least one of the operating voltages varies the frequency of the oscillations at the output through an oscillator negative differential resistance operating region broader than the negative differential resistance operating regions of each of the plurality of diodes and produced in cooperation by the negative differential resistance operating regions of each of the plurality of diodes.

9. A voltage controlled oscillator with multiple negative resistance devices as claimed in claim 8 wherein the heterostructure field effect transistor and the plurality of negative differential resistance diodes are integrated into a single heterojunction interband tunneling transistor circuit.

10. A method of operating a voltage controlled oscillator with multiple negative resistance devices comprising the steps of:

providing a transistor with a plurality of negative differential resistance diodes coupled in series to a first terminal thereof, a first biasing circuit coupled to a second terminal of the transistor, and a second biasing circuit coupled to a third terminal of the transistor;

coupling operating voltages to the second and third terminals of the transistor through the first and second biasing circuits, respectively, which set the oscillator to operating in a negative differential resistance region of at least one of the plurality of diodes so that oscillations of a selected frequency are produced at an output terminal, and the operating voltages having a range such that operation of the oscillator can be varied through the negative differential resistance operating regions of each of the plurality of diodes; and varying at least one of the operating voltages to vary the frequency of the oscillations at the output.

11. A method of operating a voltage controlled oscillator with multiple negative resistance devices as claimed in claim 10 wherein the step of providing the transistor with the negative differential resistance diodes includes integrating the transistor and the negative differential resistance diodes into a single heterojunction interband tunneling transistor circuit.

12. A method of operating a voltage controlled oscillator with multiple negative resistance devices as claimed in claim 10 wherein the step of providing the transistor includes providing a field effect transistor with gate, drain, and source terminals and the step of coupling operating voltages to the transistor includes coupling operating voltages to the gate and drain terminals.

13. A method of operating a voltage controlled oscillator with multiple negative resistance devices as claimed in claim 12 wherein the step of varying at least one of the operating voltages includes varying both of the operating voltages.

14. A method of operating a voltage controlled oscillator with multiple negative resistance devices as claimed in claim 10 wherein the step of providing a transistor with a plurality of negative differential resistance diodes includes providing a heterojunction field effect transistor with source, drain and gate terminals, connecting the negative differential resistance diodes in series to the source terminal of the transistor, connecting a first inductance to the drain terminal and a second inductance to the gate terminal, and coupling the operating voltages to the drain and gate terminals through the first and second inductances.

* * * * *